United States Patent
Ishikura et al.

(10) Patent No.: US 10,700,540 B2
(45) Date of Patent: Jun. 30, 2020

(54) DC POWER SUPPLY SYSTEM

(71) Applicant: Murata Manufacturing Co., Ltd., Nagaokakyo-shi, Kyoto-fu (JP)

(72) Inventors: Yuki Ishikura, Nagaokakyo (JP); Shuichi Tagawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/124,343

(22) Filed: Sep. 7, 2018

(65) Prior Publication Data
US 2019/0006870 A1 Jan. 3, 2019

Related U.S. Application Data

(63) Continuation of application No. PCT/IB2018/050994, filed on Feb. 19, 2018.

(30) Foreign Application Priority Data

Jan. 26, 2017 (JP) .................................. 2017-012303

(51) Int. Cl.
*H02J 7/00* (2006.01)
*H02J 7/35* (2006.01)
(Continued)

(52) U.S. Cl.
CPC .............. *H02J 7/0068* (2013.01); *H02J 1/00* (2013.01); *H02J 3/32* (2013.01); *H02J 3/383* (2013.01);
(Continued)

(58) Field of Classification Search
CPC .... H02J 7/0068; H02J 1/00; H02J 3/32; H02J 3/383; H02J 7/35; H02S 40/32; H02S 40/38; H01L 31/028; H01L 31/0322
See application file for complete search history.

(56) References Cited

U.S. PATENT DOCUMENTS

2012/0188806 A1* 7/2012 Tamura ................... H02J 3/383
  363/95
2013/0257152 A1* 10/2013 Matsui .................. H01M 10/44
  307/22

FOREIGN PATENT DOCUMENTS

JP    2012115115 A    6/2012
JP    2013138539 A    7/2013
(Continued)

OTHER PUBLICATIONS

International Search Report issued in PCT/1132018/050994, dated Mar. 27, 2018.

(Continued)

*Primary Examiner* — Carlos Amaya
(74) *Attorney, Agent, or Firm* — Arent Fox LLP

(57) ABSTRACT

A DC power supply system that limits the number of times of charging/discharging of the storage battery when a DC load is connected to a DC bus line. The system includes a DC bus line connectable to a DC load; a power generation device for supplying electric power to the DC bus line; a secondary battery for supplying electric power to the DC bus line; a DC-AC converter connected between the DC bus line and an AC power system; and a controller that controls power supply from the power generation device, the secondary battery, and the DC-AC converter to the DC bus line, and when the power supply of the power generation device cannot satisfy a power supply request of the DC load, the controller controls the DC-AC converter to supply electric power in preference to the secondary battery from the power system.

20 Claims, 5 Drawing Sheets

(51) Int. Cl.
  *H02J 1/00*     (2006.01)
  *H01L 31/032*   (2006.01)
  *H02S 40/32*    (2014.01)
  *H01L 31/028*   (2006.01)
  *H02S 40/38*    (2014.01)
  *H02J 3/32*     (2006.01)
  *H02J 3/38*     (2006.01)

(52) U.S. Cl.
  CPC .............. *H02J 7/35* (2013.01); *H01L 31/028* (2013.01); *H01L 31/0322* (2013.01); *H02S 40/32* (2014.12); *H02S 40/38* (2014.12); *Y02E 70/30* (2013.01)

(56) References Cited

FOREIGN PATENT DOCUMENTS

| | | | |
|---|---|---|---|
| JP | 2015177647 | A | 10/2015 |
| JP | 2015201973 | A | 11/2015 |
| JP | 2016015803 | A | 1/2016 |
| JP | 2018019577 | A | 2/2018 |
| WO | 2011152512 | A1 | 12/2011 |

OTHER PUBLICATIONS

Written Opinion of the International Searching Authority issued in PCT/IB2018/050994, dated Mar. 27, 2018.

\* cited by examiner

DC POWER SUPPLY SYSTEM

CROSS REFERENCE TO RELATED APPLICATIONS

The present application is a continuation of PCT/IB2018/050994 filed Feb. 19, 2018, which claims priority to Japanese Patent Application No. 2017-012303, filed Jan. 26, 2017, the entire contents of each of which are incorporated herein by reference.

TECHNICAL FIELD

The present disclosure relates to a DC power supply system.

BACKGROUND

Currently, power supply systems that combine a solar power generation device and a storage battery exist. Such power supply systems have various arrangements made for reducing the numbers of times of charging/discharging of the storage battery.

For example, in Patent Document 1 (identified below), a deviation is obtained between a power generation amount of a solar power generation device and a power consumption amount of an AC load connected to a power system, and if the absolute value of the deviation is equal to or less than a predefined value, a switching frequency is reduced between a state of discharge from the storage battery and a state of charging of the storage battery.

Patent Document 1: Japanese Laid-Open Patent Publication No. 2015-177647.

However, the method of Patent Document 1 takes into consideration only the deviation between the power generation amount of the solar power generation device and the power consumption amount of the AC load connected to the power system. Thus, this conventional design cannot be employed in a power supply system having a DC load connected to a DC bus line in addition to an AC load.

Moreover, in a power supply system having a DC load connected to a DC bus line, a power supply path to the DC load includes not only a path from the solar power generation device and a path from the storage battery, but also a path from the power system. Therefore, in such a power supply system, the power consumption amount of the DC load and the power consumption amount of the AC load independently affect each other, so that the method of Patent Document 1 cannot be employed.

Yet further, since the method of Patent Document 1 takes into consideration only the deviation from the power consumption amount of the AC load connected to the power system, if the absolute value of the deviation exceeds a predefined value, the storage battery is possibly discharged regardless of whether the power consumption amount of the DC load is abruptly changed. Therefore, the method has a problem of the increased numbers of times of charging/discharging of the storage battery.

Furthermore, since the storage battery is possibly discharged even when the power consumption amount of the DC load is not abruptly changed in the method of Patent Document 1, an amount of charge of the storage battery may not be sufficient so that the storage battery cannot be discharged when the power consumption amount of the DC load is abruptly changed.

SUMMARY OF THE INVENTION

The present invention addresses the above-noted problems and provides a DC power supply system not increasing the numbers of times of charging/discharging of the storage battery even when a DC load is connected to a DC bus line in addition to an AC load connected to the power system side.

A first exemplary aspect of the present disclosure includes a DC bus line configured to connect DC load; a power generation device for supplying electric power to the DC bus line; a secondary battery configured to supply electric power to the DC bus line; a DC-AC converter connected between the DC bus line and an AC power system for converting a DC output supplied from the DC bus line into an alternating current or converting an AC power supplied from the power system into a direct current; and a controller configured to control power supply from each of the power generation device, the secondary battery, and the DC-AC converter to the DC bus line. Moreover, when the power supply of the power generation device is unable to satisfy a power supply request of the DC load and as long as the electric power supplied by the DC-AC converter from the power system through the DC bus line to the DC load is lower than a second power value, the controller is configured to provide control such that the DC-AC converter supplies electric power in preference to the secondary battery from the power system through the DC bus line to the DC load.

According to the exemplary aspect, the numbers of times of charging/discharging of the storage battery can be prevented from increasing even when a DC load is connected to a DC bus line in addition to an AC load connected to the power system side.

DETAILED DESCRIPTION OF EXEMPLARY EMBODIMENTS

Exemplary embodiments of the present disclosure will be described as follows.

First Exemplary Embodiment

Figure 1:
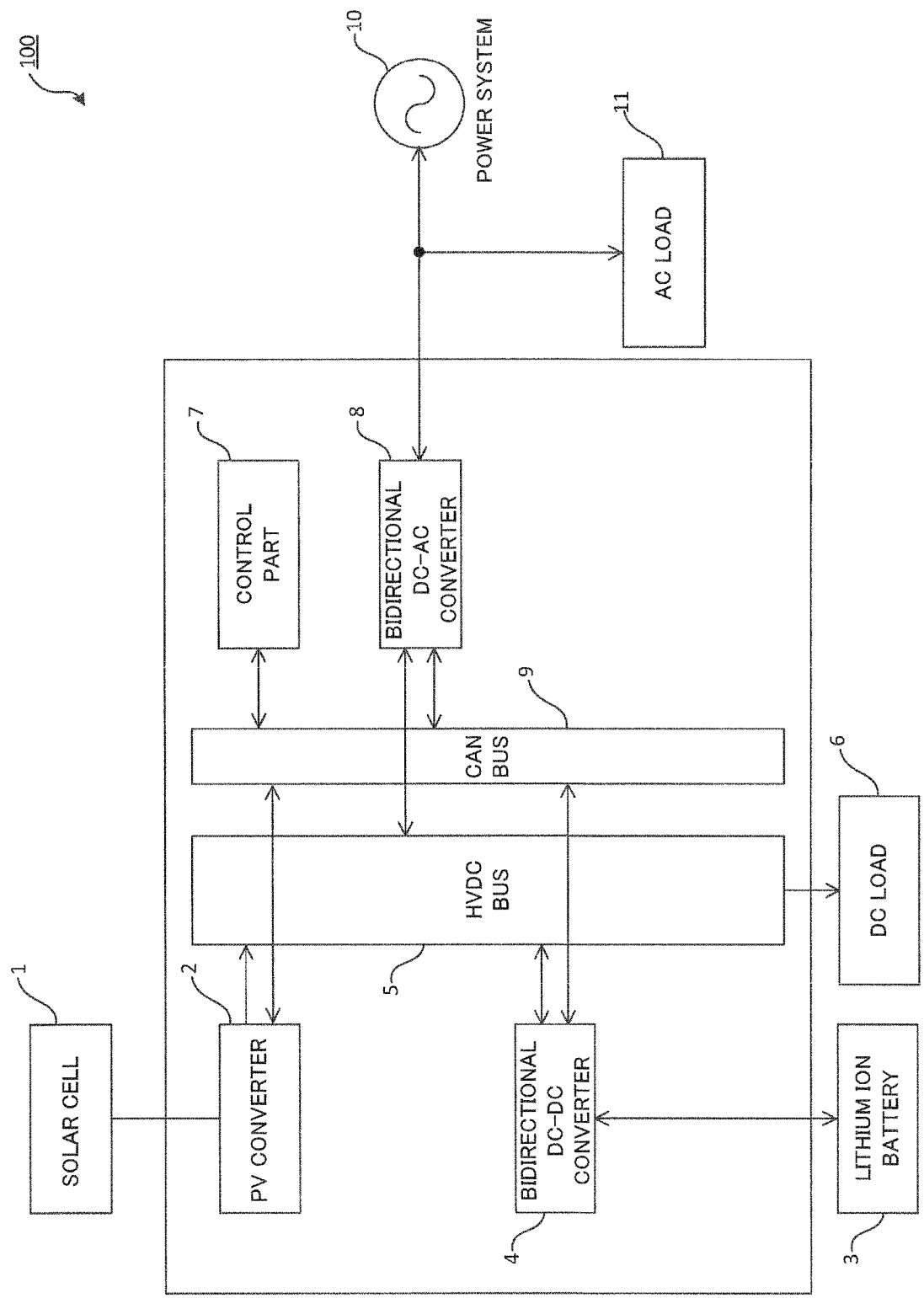
FIG. 1 is a diagram of a schematic configuration of a DC power supply system of a first exemplary embodiment.

First, a DC power supply system according to a first exemplary embodiment of the present disclosure will be described in detail with reference to the drawings. FIG. 1 is a diagram of a schematic configuration of a DC power supply system 100 according to this embodiment. As shown in FIG. 1, the DC power supply system 100 includes a solar cell 1, a PV converter 2, a lithium ion battery 3, a bidirectional DC-DC converter 4, an HVDC bus 5, and a DC load 6. The DC power supply system 100 also includes a control part 7 (or "controller"), a bidirectional DC-AC converter 8, a CAN bus 9, a power system 10, and an AC load 11 connected between the bidirectional DC-AC converter 8 and the power system 10.

The solar cell 1 acting as a power generation device is, for example, a silicon solar cell or a compound semiconductor CIS solar cell composed of copper (Cu), indium (I), and selenium (Se), according to exemplary aspects.

Moreover, the PV (Photovoltaic) converter 2 is configured to perform maximum power point tracking (MPPT) control for output power of the solar cell 1 and supplies electric power to the HVDC bus 5.

The lithium ion battery 3 acting as a secondary battery is a storage battery that can be charged and discharged. It is noted that the secondary battery may be a storage battery of a type other than the lithium ion battery 3, such as a sodium-sulfur battery.

The bidirectional DC-DC converter 4 is connected to the lithium ion battery 3 and the HVDC bus 5 and converts a voltage value of the output voltage of the lithium ion battery 3 into a predetermined voltage value before supplying to the HVDC bus 5. The bidirectional DC-DC converter 4 also converts a voltage value of the voltage supplied through the HVDC bus 5 to a predetermined voltage value before supplying to the lithium ion battery 3.

The HVDC bus 5 acting as a DC bus line is a bus for high-voltage direct current (HVDC) power supply and is connected to the PV converter 2, the bidirectional DC-DC converter 4, the DC load 6, and the bidirectional DC-AC converter 8.

The DC load 6 is a device connected to the HVDC bus 5 and configured to be driven by direct current, for example, the DC load 6 can be a refrigerator or an air conditioner, for example.

The control part 7 (or "controller") can include a CPU, a ROM, and a RAM, for example. The control part 7 is connected through the CAN bus 9 to the PV converter 2, the bidirectional DC-DC converter 4, and the bidirectional DC-AC converter 8 and controls these converters. The control part 7 can include software, that when executed by the CPU, is configured to execute the algorithms described herein.

The bidirectional DC-AC converter 8 acting as a DC-AC converter is connected to the power system 10 and the HVDC bus 5 and converts an AC voltage supplied from the power system 10 into a DC voltage before supplying to the HVDC bus 5. The bidirectional DC-AC converter 8 converts a DC voltage supplied to the HVDC bus 5 into an AC voltage before supplying to the AC load 11 or causing a reverse power flow to the power system 10.

Moreover, the CAN (controller area network) bus 9 is connected to the PV converter 2, the bidirectional DC-DC converter 4, the control part 7, and the bidirectional DC-AC converter 8 and is used as a transmission path of signals such as control signals.

In an exemplary aspect, the power system 10 is supplied with a commercial AC voltage of 200 V etc. The DC voltage of the solar cell 1 supplied though the HVDC bus 5 can be converted into an AC voltage by the bidirectional DC-AC converter 8 and supplied to the power system 10 for selling electric power.

As described above, the DC power supply system 100 according to this exemplary embodiment uses direct current for supplying the internal current and voltage and therefore eliminates the need for a switch such as a relay thereby enabling seamless switching of a power supply path when it is necessary to switch the power supply path.

Figure 2:
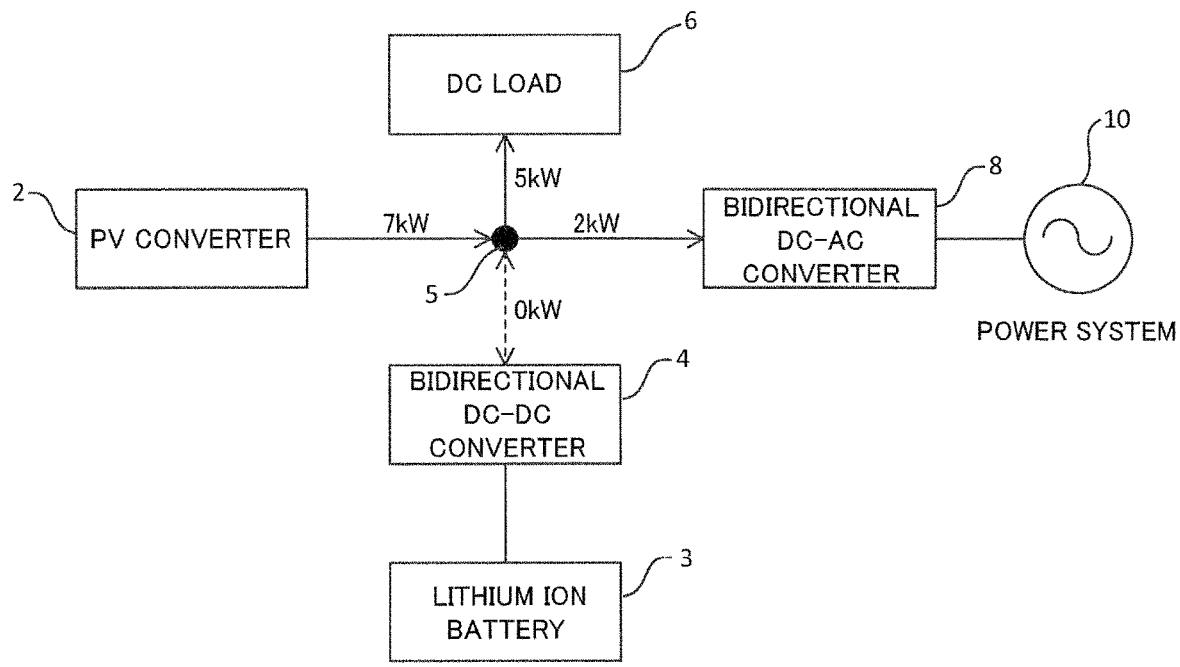
FIG. 2 is a diagram for explaining an operation in a steady state of the DC power supply system.
Figure 3:
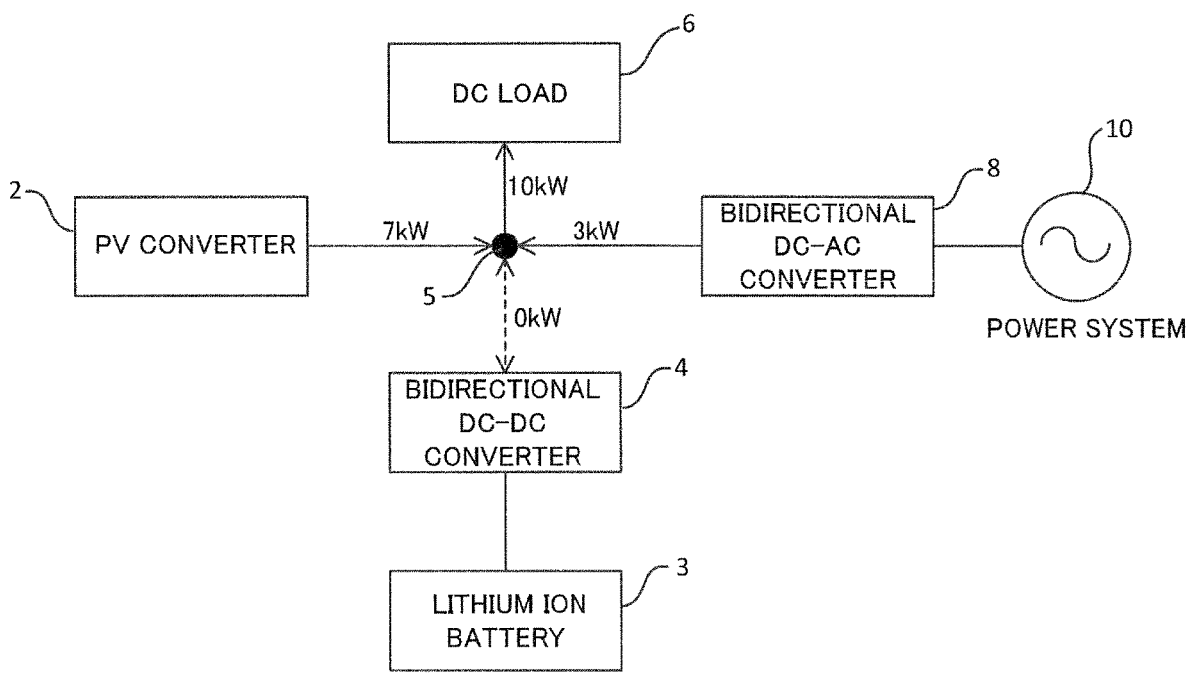
FIG. 3 is a diagram for explaining an operation in the case that a power consumption of a DC load has increased in the DC power supply system.
Figure 4:
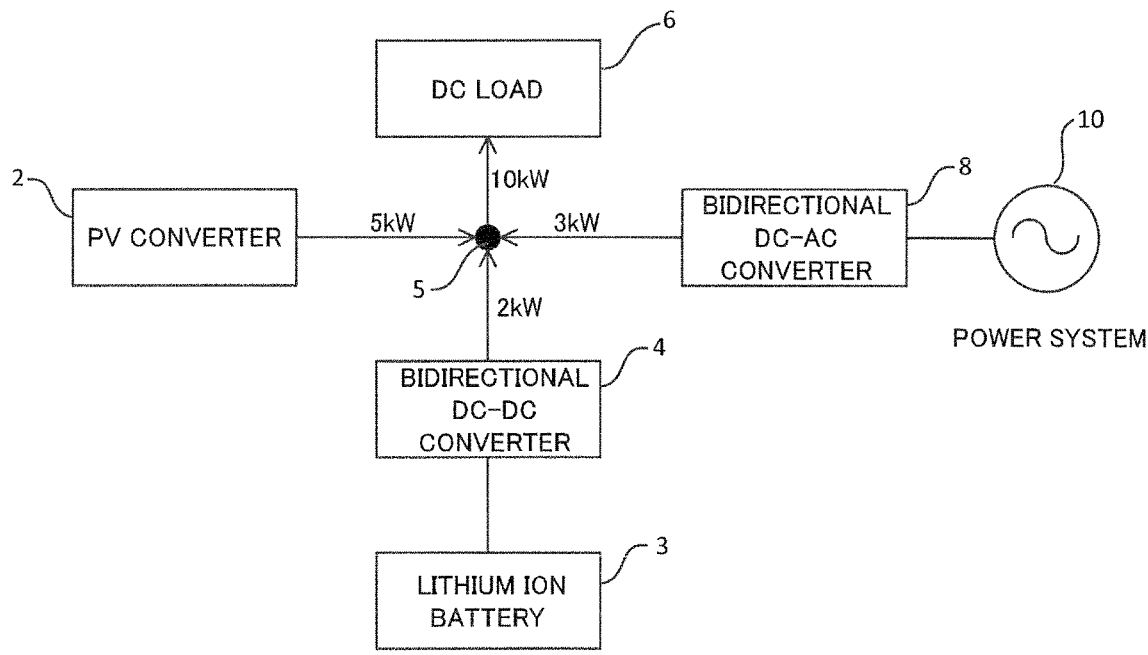
FIG. 4 is a diagram for explaining an operation when the power consumption of the DC load has increased while a power generation amount of the power generation device has decreased in the DC power supply system.
Figure 5:
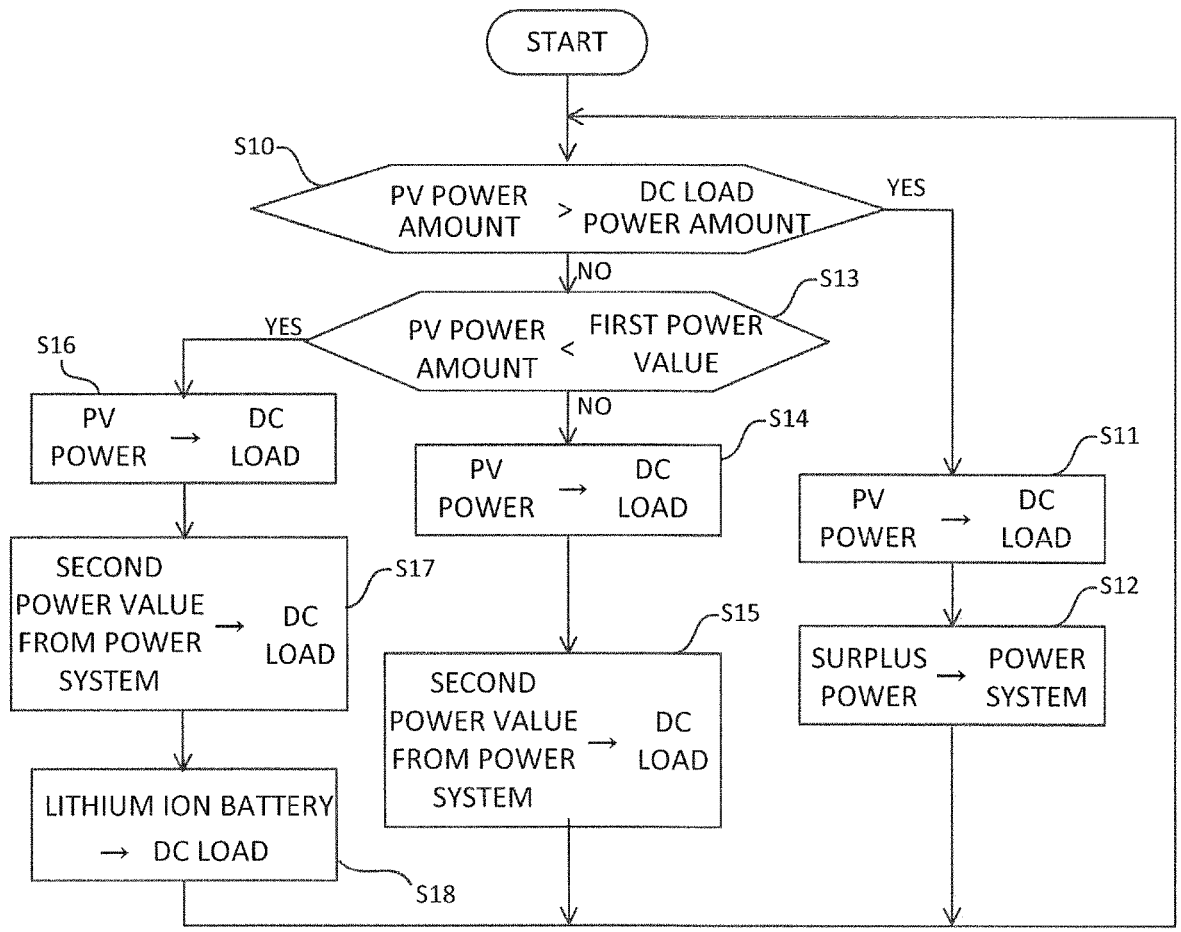
FIG. 5 is a flowchart of an operation of a control part in the DC power supply system.
Figure 6:
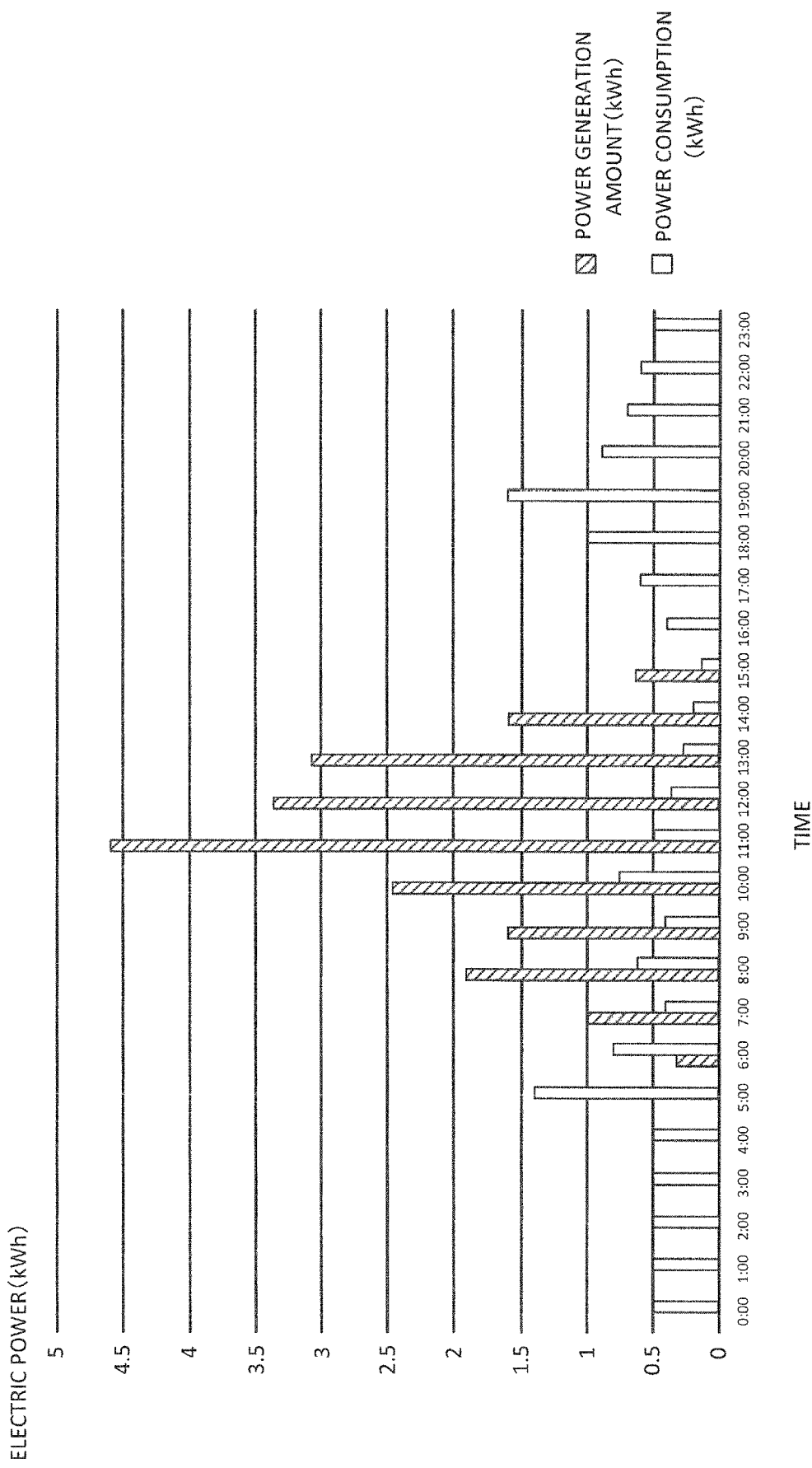
FIG. 6 is a diagram of comparison between the power consumption of the DC load and the generated power for each time zone.

An operation of the DC power supply system 100 according to this embodiment as described above will be described with reference to the accompanying drawings. FIG. 2 is a diagram for explaining an operation in a steady state of the DC power supply system 100. FIG. 3 is a diagram for explaining an operation in the case that the power consumption of the DC load 6 has increased in the DC power supply system 100. FIG. 4 is a diagram for explaining an operation in the case that the power consumption of the DC load 6 has increased while a power generation amount of the solar cell 1 has decreased in the DC power supply system 100. FIG. 5 is a flowchart of an operation of the control part 7 in the DC power supply system 100. FIG. 6 is a diagram of comparison between the power consumption of the DC load and the generated power for each time zone.

The DC power supply system 100 of this exemplary embodiment has a generated power sensor (not shown) disposed in a connection path between the output stage of the PV converter 2 and the HVDC bus 5 so that the control part 7 can detect a power generation amount of the solar cell 1. Additionally, a power sensor (not shown) is disposed in a connection path between the input/output stage of the bidirectional DC-DC converter 4 and the HVDC bus 5 so that the control part 7 can detect a discharging power amount and a charging power amount of the lithium ion battery 3. Furthermore, a power sensor (not shown) is disposed in a connection path between the input stage of the DC load 6 and the HVDC bus 5 so that the control part 7 can detect a power consumption amount of the DC load. Moreover, a power sensor (not shown) is disposed in a connection path between the input/output stage of the bidirectional DC-AC converter 8 and the HVDC bus 5 so that the control part 7 can detect an amount of power supplied to the power system 10 and an amount of power supplied from the power system 10. Furthermore, a power sensor (not shown) is disposed in the power system 10 so that the control part 7 can detect an amount of power of the reverse power flow to the power system 10. In this exemplary embodiment, the AC load 11 connected between the bidirectional DC-AC converter 8 and the power system 10 is considered as not being connected and is omitted for simplicity.

(Operation in Steady State)

First, the control part 7 compares the power generation amount of the solar cell 1 with the power consumption amount of the DC load 6 (FIG. 5: S10). In FIG. 5, the power generation amount of the solar cell 1 is denoted as "PV power amount", and the power consumption amount of the DC load 6 is denoted as "DC load power amount". When determining that the power generation amount exceeds the power consumption amount (FIG. 5: S10, YES), the control part 7 controls supply of the power generated by the solar cell 1 to the DC load 6 (FIG. 5: S11) and controls the reverse power flow of surplus power to the power system 10 (FIG. 5: S12). Specifically, the control part 7 configures the bidirectional DC-DC converter 4 into an inactive state and configures the bidirectional DC-AC converter 8 into an active state. The control part 7 then controls the bidirectional DC-AC converter 8 to cause the reverse power flow of surplus power to the power system 10.

In an example shown in FIG. 2, the power generation amount of the solar cell 1 is 7 kW and the power consumption amount of the DC load 6 is 5 kW, and therefore, out of the power generation amount of the solar cell 1, the control part 7 supplies 5 kW to the DC load 6 and outputs 2 kW of surplus power to the power system 10 side. In other words, 2 kW of electric power is sold. In this case, the charging of the lithium ion battery 3 and the discharging from the lithium ion battery 3 are not performed. When the amount of charge of the lithium ion battery 3 is not sufficient, the surplus power may be used for charging the lithium ion battery 3.

(Operation in the Case that Power Consumption of DC Load 6 Has Increased)

During the operation in the steady state as described above, the power consumption of the DC load 6 may increases for some reason. In this case, the control part 7 determines that the power generation amount is lower than the power consumption amount (FIG. 5: S10, NO) and determines whether the power generation amount is lower than a first power value (FIG. 5: S13). This determination is made for compensating for the shortage of electric power amount while suppressing excessive power supply from the power system 10. When determining that the power generation amount is not lower than the first power value (FIG. 5: S13, NO), the control part 7 provides control to supply the power generated by the solar cell 1 to the DC load 6 (FIG. 5: S14) and to supply a second power value corresponding to the shortage from the power system 10 to the DC load 6 (FIG. 5: S15). Specifically, the control part 7 configures the bidirectional DC-DC converter 4 into the inactive state and configures the bidirectional DC-AC converter 8 into the active state. The control part 7 then controls the bidirectional DC-AC converter 8 to supply the second power value to the DC load 6.

In this embodiment, for example, the first power value is set to 7 kW. In an example shown in FIG. 3, the power consumption amount of the DC load 6 increases to 10 kW, while the power generation amount of the solar battery 1 is 7 kW, and therefore, the control part 7 determines that the power generation amount is lower than the power consumption amount. The control part 7 also determines that the power generation amount of the solar cell 1 is 7 kW and is not lower than the first power value. Therefore, the control part 7 supplies the power generation amount of the solar cell 1, i.e., 7 kW, to the DC load 6 and supplies 3 kW of electric power corresponding to the shortage from the power system 10 through the bidirectional DC-AC converter 8. Therefore, 3 kW of electric power is purchased. In this case, the charging of the lithium ion battery 3 and the discharging from the lithium ion battery 3 are not performed.

As described above, when determining that the power supply of the solar battery 1 cannot satisfy a power supply request of the DC load 6, the control part 7 provides control such that the bidirectional DC-AC converter 8 supplies electric power in preference to the lithium ion battery 3 from the power system 10 through the HVDC bus 5 to the DC load 6. Therefore, according to exemplary embodiment of the present disclosure, the number of times of discharging of the lithium ion battery 3 can be reduced, and consequently, the number of times of charging of the lithium ion battery 3 can be reduced, so that the life of the lithium ion battery 3 can be made longer.

(Operation in the Case that Power Generation Amount of Solar Cell 1 Has Decreased)

The power consumption of the DC load 6 increases for some reason, while the power generation amount of the solar cell 1 decreases due to environmental conditions and becomes lower than the first power value in some cases. When determining that the power generation amount is lower than the first power value (FIG. 5: S13, YES), the control part 7 provides control to supply the generated power to the DC load 6 (FIG. 5: S16) and to supply the second power value from the power system 10 to the DC load 6 (FIG. 5: S17). The control part 7 also provides control to supply the electric power for the shortage from the lithium ion battery 3 to the DC load 6 (FIG. 5: S18). Specifically, the control part 7 configures the bidirectional DC-DC converter 4 into the activate state and controls the bidirectional DC-DC converter 4 to supply the electric power corresponding to the shortage to the DC load 6. Additionally, the control part 7 configures the bidirectional DC-AC converter 8 into the activate state and controls the bidirectional DC-AC converter 8 to supply the second power value to the DC load 6.

In an example shown in FIG. 4, the power consumption amount of the DC load 6 increases to 10 kW, while the power generation amount of the solar battery 1 is 7 kW, and therefore, the control part 7 determines that the power generation amount is lower than the power consumption amount. The control part 7 also determines that the power generation amount of the solar cell 1 decreases to 5 kW and is lower than the first power value. Therefore, the control part 7 supplies the amount of the power generated by the solar cell 1, i.e., 5 kW, to the DC load 6 and supplies 3 kW of electric power from the power system 10 through the bidirectional DC-AC converter 8. Therefore, 3 kW of electric power is purchased. Furthermore, the control part 7 supplies 2 kW of electric power from the lithium ion battery 3 to the DC load 6 through the bidirectional DC-DC converter 4. It is noted that the first and second power values as described herein can be preset or predetermined by an administrator of the DC power supply system 100, for example, in order maximize system efficiency and minimize the charging and discharging of the secondary battery (e.g., lithium ion battery 3).

As described above, when determining that the power supply of the solar cell 1 is lower than the first power value, the control prat 7 provides control such that the bidirectional DC-AC converter 8 supplies the second power value from the power system 10 through the HVDC bus 5 to the DC load 6. The control part 7 also provides control such that electric power is supplied from the lithium ion battery 3 through the HVDC bus 5 to the DC load 6.

Therefore, according to the exemplary embodiment of the present disclosure, the lithium ion battery 3 can compensate for an amount of electric power corresponding to the shortage while suppressing excessive power supply from the power system 10.

As shown in FIG. 6, the power generation amount of the solar cell 1 is particularly affected by hours of sunshine and becomes almost zero except for the time zone from 6:00 to 15:00. However, the power consumption amount of the DC load 6 tends to peak during hours other than this time zone. For example, in the case of FIG. 6, the amount peaks at 5:00 in the morning and at 19:00 in the evening. A basic electricity rate is determined by how much electric power is used to the maximum in terms of an average value per unit time (e.g., 30 minutes).

Therefore, if the peak power consumption amount of the DC load 6 shown in FIG. 6 cannot be covered by the power generation amount of the solar cell 1, and the shortage is entirely filled up by power supply from the power system 10 through the bidirectional DC-AC converter 8, the maximum power usage is considered as the peak electric power.

Therefore, in the exemplary embodiment of the present disclosure, if the power supply of the solar cell 1 is lower than the first power value, the electric power supplied from the power system 10 to the DC load 6 through the bidirectional DC-AC converter 8 is suppressed to the second power value, and the lithium ion battery 3 compensates for the shortage. In this embodiment, the second power value is set to a value smaller than the peak power consumption amount.

In this way, the peak power consumption amount can be cut down to suppress the maximum power consumption amount in terms of the average value per unit time.

According to the exemplary embodiment of the present disclosure, the DC load 6 is connected to the HVDC bus 5, and the output power from the lithium ion battery 3 is supplied to the DC load 6 only when the power consumption amount of the DC load 6 cannot be covered by the power generation amount of the solar cell 1 and the supply power from the power system 10 at the second power value. Therefore, according to the exemplary aspect, the life of the lithium ion battery 3 can be made longer by reducing the numbers of times of charging/discharging of the lithium ion battery 3 while suppressing the maximum power consumption amount at a lower level in the power system 10.

Since the power supply from the lithium ion battery 3 to the DC load 6 is limited to the case described above, the amount of charge of the lithium ion battery 3 does not run short in a situation where the power supply from the lithium ion battery 3 is required, and the power supply request of the DC load 6 can reliably be satisfied. Furthermore, even when the power consumption amount of the DC load 6 is abruptly changed, electric power can reliably be supplied from the lithium ion battery 3 to the DC load 6.

Second Embodiment

Figure 7:
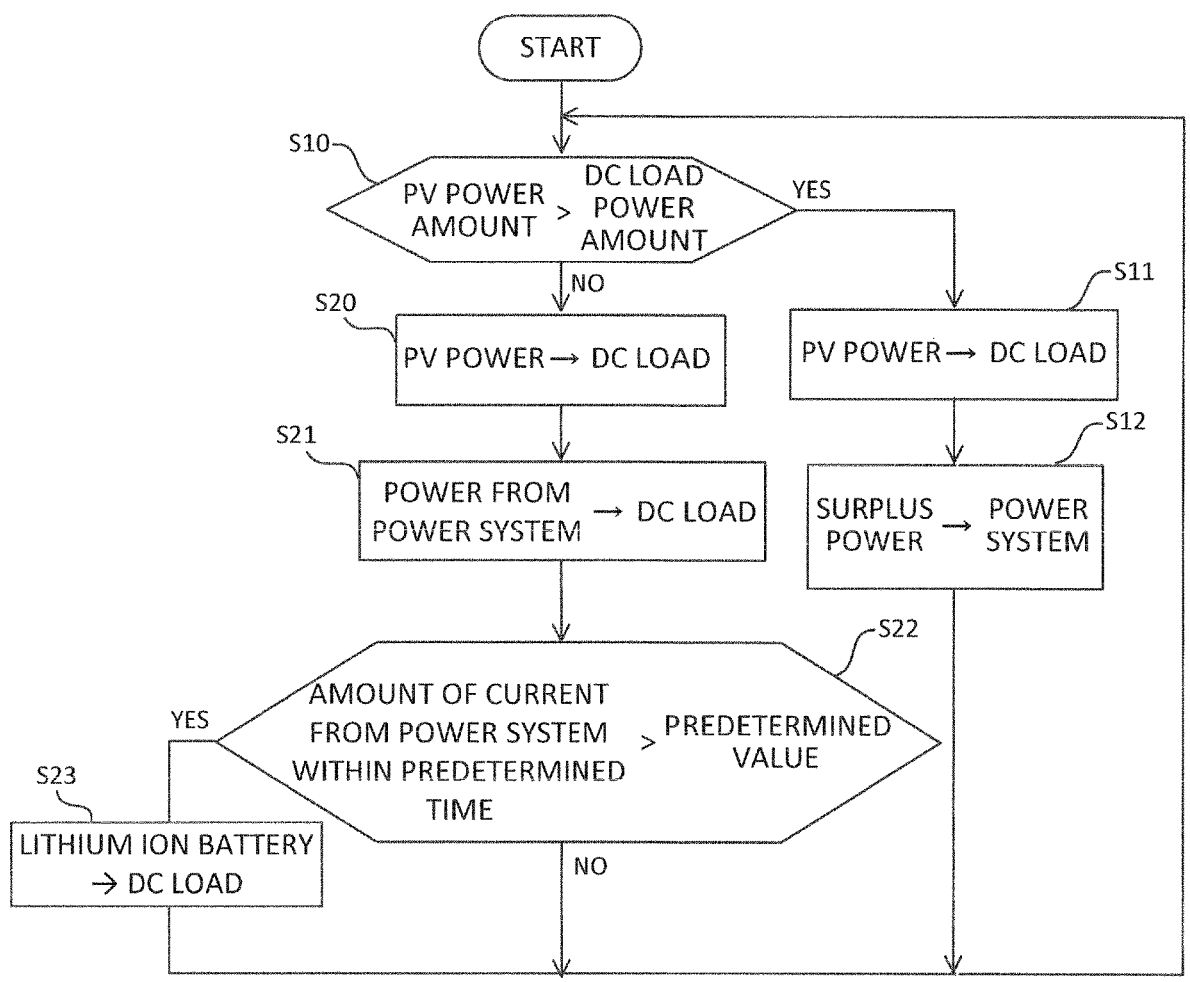
FIG. 7 is a flowchart of an operation of the control part in the DC power supply system according to a second exemplary embodiment.

A second exemplary embodiment of the present disclosure will be described with reference to the drawings. FIG. 7 is a flowchart of an operation of the control part in the DC power supply system according to the second embodiment.

In the first exemplary embodiment described above, when the power generation amount of the solar cell 1 cannot satisfy the power supply request of the DC load 6 and is lower than the first power value, electric power is supplied from the lithium ion battery 3. However, in this exemplary embodiment, when the control part 7 predicts that an amount of current supplied from the power system 10 exceeds a predetermined value, control is provided such that the amount of current does not exceed the predetermined value.

In this exemplary embodiment, when the power generation amount of the solar cell 1 exceeds the power consumption amount of the DC load 6, the control is the same as the first embodiment and therefore will not be described.

When determining that the power generation amount of the solar cell 1 is lower than the power consumption amount of the DC load 6 (FIG. 7: S10, NO), the control part 7 provides control to supply the generated power to the DC load 6 (FIG. 7: S20) and to supply electric power from the power system 10 through the bidirectional DC-AC converter 8 to the DC load 6 (FIG. 5: S21).

Subsequently, based on output of a power consumption amount sensor (not shown) of the power system 10, the control part 7 determines whether the amount of current supplied from the power system 10 is predicted to exceed a predetermined value within a predetermined time (FIG. 7: S22). For example, when the amount of current of the power system 10 is at the peak amount of current shown in FIG. 6 for 15 minutes or more, the control part 7 determines that the amount of current supplied from the power system 10 exceeds a predetermined value within a predetermined time (FIG. 7: S22, YES). When making the determination as described above, the control part 7 provides control to supply the output power from the lithium ion battery 3 through the bidirectional DC-DC converter 4 to the DC load 6 (FIG. 7: S23). Specifically, the control part 7 controls the bidirectional DC-AC converter 8 such that the amount of current supplied from the power system 10 does not exceed the predetermined value and controls the bidirectional DC-DC converter 4 such that an amount of the electric power corresponding to the shortage is output from the lithium ion battery 3.

As described above, when the amount of current supplied from the power system 10 is predicted to exceed the predetermined value within a predetermined time, the control part 7 provides control such that electric power is supplied from the power system 10 through the HVDC bus 5 to the DC load 6 without exceeding the predetermined value. The control part 7 also provides control to supply electric power from the lithium ion battery 3 through the HVDC bus 5 to the DC load 6.

The peak of the power consumption of the power system 10 as shown in FIG. 6 does not continue for a long time and is often limited to a period of 15 minutes to 30 minutes, for example. Therefore, in this embodiment, for example, when the amount of current of the power system 10 is at the peak amount shown in FIG. 6 for 15 minutes or more, the amount of current supplied from the power system 10 is prevented from exceeding the predetermined value so that the peak described above is cut down to suppress the maximum power consumption amount in terms of the average value per unit time.

Even when the control is provided in this way, the life of the lithium ion battery 3 can be made longer by reducing the numbers of times of charging/discharging of the lithium ion battery 3 while suppressing the maximum power consumption amount at a lower level in terms of the average value per unit time in the power system 10.

Since the power supply from the lithium ion battery 3 to the DC load 6 is limited to the case described above, the amount of charge of the lithium ion battery 3 does not run short in a situation where the power supply from the lithium ion battery 3 is required, and the power supply request of the DC load 6 can reliably be satisfied.

REFERENCE NUMBERS

1 solar cell
3 lithium ion battery
6 DC load
7 control part
10 power system
100 DC power supply system

The invention claimed is:
1. A DC power supply system comprising:
a DC bus line configured to connect a DC load;
a power generation device configured to supply electric power to the DC bus line;
a secondary battery configured to supply electric power to the DC bus line;
a DC-AC converter connected between the DC bus line and a power system, the DC-AC converter configured to convert a DC output supplied from the DC bus line into an alternating current and to convert an AC power received from the power system into a direct current; and
a controller configured to control power supply from each of the power generation device, the secondary battery, and the DC-AC converter to the DC bus line,
wherein, when the power generation device is unable to satisfy a power supply request of the DC load and when the electric power supplied by the DC-AC converter from the power system through the DC bus line to the DC load is lower than a second power value, the controller is configured to control the DC-AC converter to supply electric power in preference to the secondary battery from the power system through the DC bus line to the DC load, wherein the controller is configured to control the DC-AC converter to increase the electric power supplied from the power system to prevent the secondary battery from discharging in response to an increase of power consumption of the DC load, and wherein, when the electric power supplied to the DC load is below the second power value, the controller is configured to control the DC-AC converter to supply a shortage to the DC load that is a difference between the supplied electric power and the second power value.

2. The DC power supply system according to claim 1, wherein, when the electric power supplied by the power generation device is lower than a first power value, the controller is configured to control the DC-AC converter to supply the second power value from the power system through the DC bus line to the DC load while electric power is supplied from the secondary battery through the DC bus line to the DC load.

3. The DC power supply system according to claim 2, further comprising a DC-DC converter connected between the DC bus line and the secondary battery.

4. The DC power supply system according to claim 3, wherein the controller is configured to control the DC-DC converter to supply the electric power from the secondary battery through the DC bus line to the DC load when the electric power supplied by the power generation device is lower than the first power value.

5. The DC power supply system according to claim 1, wherein, when the controller predicts that an amount of current supplied from the power system will exceed a predetermined value within a predetermined time, the controller is configured to control the DC-AC converter such that the power system supplies electric power through the DC bus line to the DC load without exceeding the predetermined value while electric power is supplied from the secondary battery through the DC bus line to the DC load.

6. The DC power supply system according to claim 5, further comprising:
a DC-DC converter connected between the DC bus line and the secondary battery,
wherein the controller is configured to control the DC-DC converter to supply the electric power from the secondary battery through the DC bus line to the DC load when the electric power supplied by the power generation device is lower than a first power value.

7. The DC power supply system according to claim 1, wherein the power generation device is one of a silicon solar cell or a compound semiconductor CIS solar cell.

8. The DC power supply system according to claim 1, wherein, when the electric power supplied by the power generation device exceeds a power consumption amount of the power supply request of the DC load, the controller is configured to control the DC-AC converter to supply a surplus of the electric power supplied by the power generation device to the power system.

9. The DC power supply system according to claim 8, further comprising:
a photovoltaic converter configured to convert the electric power supplied by the power generation device to the DC output, wherein the DC-AC converter is coupled between the photovoltaic converter and the power system and is configured to convert the DC output into the alternating current to supply the surplus of the electric power to the power system.

10. A DC power supply system comprising:
a power generation device configured to supply electric power;
a DC-AC converter coupled between the power generation device and a power system, the DC-AC converter configured to convert the electric power supplied by the power generation device into an alternating current and to convert an AC power received from the power system into a direct current; and
a controller configured to control the DC-AC converter to supply electric power in preference to a secondary battery from the power system to a DC load when the power generation device cannot supply sufficient electric power to satisfy a power supply request of the DC load and when electric power supplied by the DC-AC converter from the power system to the DC load is lower than a preset power value, wherein the controller is configured to control the DC-AC converter to increase the electric power supplied from the power system to prevent the secondary battery from discharging in response to an increase of power consumption of the DC load, and wherein, when the electric power supplied to the DC load is below the preset power value, the controller is configured to control the DC-AC converter to supply a shortage to the DC load that is a difference between the supplied electric power and the preset power value.

11. The DC power supply system according to claim 10, further comprising a DC bus line connecting each of the power generation device, the DC load, the DC-AC converter and the controller, such that the DC bus line supplies each of the electric power supplied by both of the power generation device and the DC-AC converter to the DC load.

12. The DC power supply system according to claim 11, wherein, when the electric power supplied by the power generation device is lower than another preset power value, the controller is configured to control the DC-AC converter to supply the preset power value from the power system through the DC bus line to the DC load while electric power is supplied from the secondary battery through the DC bus line to the DC load.

13. The DC power supply system according to claim 12, further comprising a DC-DC converter connected between the DC bus line and the secondary battery.

14. The DC power supply system according to claim 13, wherein the controller is configured to control the DC-DC converter to supply the electric power from the secondary battery through the DC bus line to the DC load when the electric power supplied by the power generation device is lower than the another preset power value.

15. The DC power supply system according to claim 10, wherein, when the controller predicts that an amount of current supplied from the power system will exceed a predetermined value within a predetermined time, the controller is configured to control the DC-AC converter such that the power system supplies electric power to the DC load without exceeding the predetermined value while electric power is supplied from the secondary battery to the DC load.

16. The DC power supply system according to claim 15, further comprising a DC-DC converter connected between the DC load and the secondary battery.

17. The DC power supply system according to claim 16, wherein the controller is configured to control the DC-DC converter to supply the electric power from the secondary battery to the DC load when the electric power supplied by the power generation device is lower than another preset power value.

18. The DC power supply system according to claim 10, wherein the power generation device is one of a silicon solar cell or a compound semiconductor CIS solar cell.

19. The DC power supply system according to claim 10, wherein, when the electric power supplied by the power generation device exceeds a power consumption amount of the power supply request of the DC load, the controller is configured to control the DC-AC converter to supply a surplus of the electric power generated by the power generation device to the power system.

20. The DC power supply system according to claim 19, further comprising:
- a photovoltaic converter configured to convert the electric power supplied by the power generation device to a DC output,
- wherein the DC-AC converter is coupled between the photovoltaic converter and the power system and is configured to convert the DC output into the alternating current to supply the surplus of the electric power to the power system.

* * * * *